United States Patent
Jianping

(10) Patent No.: US 7,356,311 B2
(45) Date of Patent: Apr. 8, 2008

(54) WIRELESS AUDIO SIGNAL AND CONTROL SIGNAL DEVICE AND METHOD THEREOF

(75) Inventor: Gao Jianping, Shanghai (CN)

(73) Assignee: Shanghai Maultak Technology Development Co., Ltd., Shanghai (CN)

( * ) Notice: Subject to any disclaimer, the term of this patent is extended or adjusted under 35 U.S.C. 154(b) by 446 days.

(21) Appl. No.: 10/965,439

(22) Filed: Oct. 13, 2004

(65) Prior Publication Data

US 2005/0079827 A1   Apr. 14, 2005

(30) Foreign Application Priority Data

Oct. 13, 2003   (CN)   ................. 2003 1 0107864

(51) Int. Cl.
*H04B 1/00*   (2006.01)
*H04B 7/00*   (2006.01)

(52) U.S. Cl. .................. 455/69; 455/68; 455/72; 455/131; 455/180.2; 455/227; 455/221; 348/738; 369/44.34; 369/44.41

(58) Field of Classification Search .............. 455/68, 455/72, 22, 227, 228, 221, 180.2, 130
See application file for complete search history.

(56) References Cited

U.S. PATENT DOCUMENTS

| | | | | |
|---|---|---|---|---|
| 4,280,221 A | * | 7/1981 | Chun et al. ................. | 375/288 |
| 5,214,501 A | * | 5/1993 | Cavallerano et al. ....... | 348/488 |
| 5,270,816 A | * | 12/1993 | Citta et al. ................. | 348/470 |
| 5,425,050 A | * | 6/1995 | Schreiber et al. ........... | 375/141 |
| 5,678,198 A | * | 10/1997 | Lemson .................... | 455/67.11 |
| 5,825,807 A | * | 10/1998 | Kumar ........................ | 375/130 |
| 5,825,829 A | * | 10/1998 | Borazjani et al. ........... | 375/308 |
| 6,011,824 A | * | 1/2000 | Oikawa et al. .............. | 375/377 |
| 6,205,133 B1 | * | 3/2001 | Bexten ........................ | 370/343 |
| 6,433,835 B1 | * | 8/2002 | Hartson et al. ............. | 348/608 |
| 6,441,764 B1 | * | 8/2002 | Barron et al. ................ | 341/155 |
| 7,058,140 B2 | * | 6/2006 | Smart et al. ................. | 375/316 |
| 7,071,994 B2 | * | 7/2006 | Harris et al. ................ | 348/473 |
| 7,089,032 B2 | * | 8/2006 | Hongo et al. ............. | 455/550.1 |
| 7,151,805 B2 | * | 12/2006 | Hecht ......................... | 375/298 |

\* cited by examiner

*Primary Examiner*—Marceau Milord
(74) *Attorney, Agent, or Firm*—Raymond Y. Chan; David and Raymond Patent Firm

(57) ABSTRACT

A signal transmission arrangement includes a signal transmitter and a signal receiver wirelessly communicating with the signal transmitter. The signal transmitter includes a hybrid signal device to hybridize the audio signal with the control signal to form a consolidating signal, a frequency modulator to high-frequency modulate the consolidating signal, wherein the consolidating signal is amplified and sent to the signal receiver in a wireless manner. The signal receiver includes a frequency demodulator to demodulate the consolidating signal and a signal dissociating unit to dissociate the consolidating signal to restore the audio signal and the control signal. Therefore, the signal transmission arrangement provides a low-bit rate coding transmission in control signals, in lieu of the high-bit rate coding transmission which requires the expensive high performance integrated circuit, so as to ensure the quality of the audio signal while being cost effective.

12 Claims, 4 Drawing Sheets

WIRELESS AUDIO SIGNAL AND CONTROL SIGNAL DEVICE AND METHOD THEREOF

BACKGROUND OF THE PRESENT INVENTION

1. Field of Invention

The present invention relates to a signal transmitting method, and more particularly to a wireless audio signal and control signal device and method thereof, which enhances the voice quality during the wireless signal transmission while being cost effective.

2. Description of Related Arts

The wireless transmission of voice signals is nowadays popular among the audio advices, such as the intercoms, the wireless microphones. But these apparatuses are limited to transmit analog signals. With the improvement of modern technology, the function of transmitting both voice analog signals and digital control signals controlling over the designated device are realized. In order to fulfill the stated functionality, the contemporary transmission methodology is realized with the process of firstly digitizing the analog voice signals by the analog-digital conversion (ADC), and then compressing the digitized voice signals to thereafter combine with the digital control signals, whereupon the mixture of digitized voice signals and the digital control signals are in order high-frequency modulated, high-frequency amplified, then high-frequency transmitted, referring to FIG. 1. To use low-bit rate to transmit the voice signals will suffer the poor quality of voice signals recovery due to the limitation of bandwidth. If the transmission of 20 KHz voice signals is needed, according to the sampling theory the minimum 40 KHz sampling rate is required for full recovery of the original voice signals without suffering the sampling error or sampling loss, with a 16-bit analog-digital conversion, the data storage of 640K bit per second is necessary. Even the data compression is capable of reduce the quantity of each transmission, the compression also brings effect on the loss of quality of each data and consequently limit the compression ratio. The common digital wireless phone with low-bit rate transmission which uses a 3.4 KHz bandwidth, while the frequency of human voice during conversation is in the range from 11 Hz to 8 KHz, only sustains a voice recognition standard. But the high-bit rate transmission is inevitable of using the high cost integrated circuit designated for high speed coding and decoding.

Therefore, the balance between desirable voice quality and reasonable unit cost is hard to achieve.

SUMMARY OF THE PRESENT INVENTION

A main object of the present invention is to provide a wireless audio signal and control signal device and method thereof, which enhances the voice quality during the wireless signal transmission while being cost effective.

Another object of the present invention is to provide a wireless audio signal and control signal transmitting method, wherein the audio signal and the control signal are hybridized to form a consolidating signal by either frequency division multiplexing (FDM), time division multiplexing (TDM), or encoding.

Another object of the present invention is to provide a wireless audio signal and control signal transmitting method, wherein the consolidating signal is dissociated to restore the audio signal and the control signal by filtering or decoding, which inverts the calculations of either the frequency division multiplexer, the time division multiplexer, or the encoder.

Another object of the present invention is to provide a wireless audio signal and control signal transmitting method, wherein the method directly hybridizes the analog audio signal with the digital control signal and modulates the consolidating signal to wirelessly transmit to a receiving end of the signal receiver. Therefore, no analog-to-digital conversion and compression for the analog audio signal is required to mix and to high-frequency modulate with the digital control signals before the wireless transmission, which results in the extra cost of the receiving end of the signal receiver to use either filters or decoders to dissociate the analog voice signals from the control signals. In other words, the benefits of the present invention are to use the well-developed frequency modulation in analog audio signal and the low-bit rate coding transmission in control signals, in lieu of the high-bit rate coding transmission which requires the expensive high performance integrated circuit to achieve the comparative same quantity of output, and still guarantee a preferable tradeoff between the quality of analog audio signal and a reasonable cost expense.

Accordingly, in order to accomplish the above object, the present invention provides a method of transmitting an audio signal and a control signal to a signal receiver, comprising the steps of:

(a) hybridizing the audio signal with the control signal to form a consolidating signal;

(b) high-frequency modulating the consolidating signal;

(c) amplifying the consolidating signal before transmitting the consolidating signal to the signal receiver in a wireless transmission manner;

(d) demodulating the consolidating signal; and (e) dissociating the consolidating signal to restore the audio signal and the control signal.

Also, the present invention provides a signal transmission arrangement, comprising a signal transmitter and a signal receiver wirelessly communicating with the signal transmitter.

The signal transmitter comprises a hybrid signal device to hybridize the audio signal with the control signal to form a consolidating signal, a frequency modulator to high-frequency modulate the consolidating signal, wherein the consolidating signal is amplified and sent to the signal receiver in a wireless manner.

The signal receiver comprises a frequency demodulator to demodulate the consolidating signal and a signal dissociating unit to dissociate the consolidating signal to restore the audio signal and the control signal.

These and other objectives, features, and advantages of the present invention will become apparent from the following detailed description, the accompanying drawings, and the appended claims.

DETAILED DESCRIPTION OF THE PREFERRED EMBODIMENT

Figure 1:
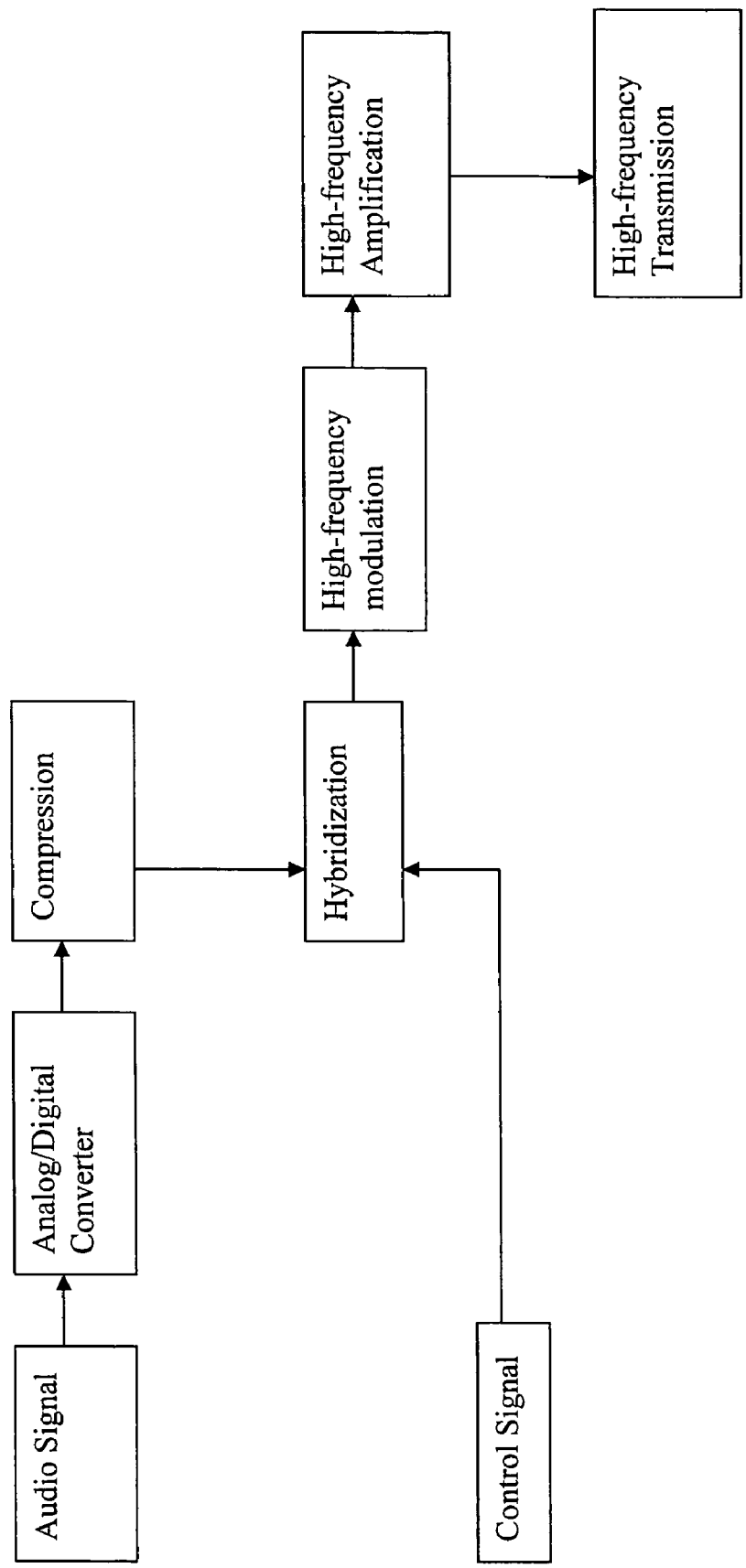
FIG. 1 is a flow diagram of a conventional method of transmitting audio signals and control signals.
Figure 2:
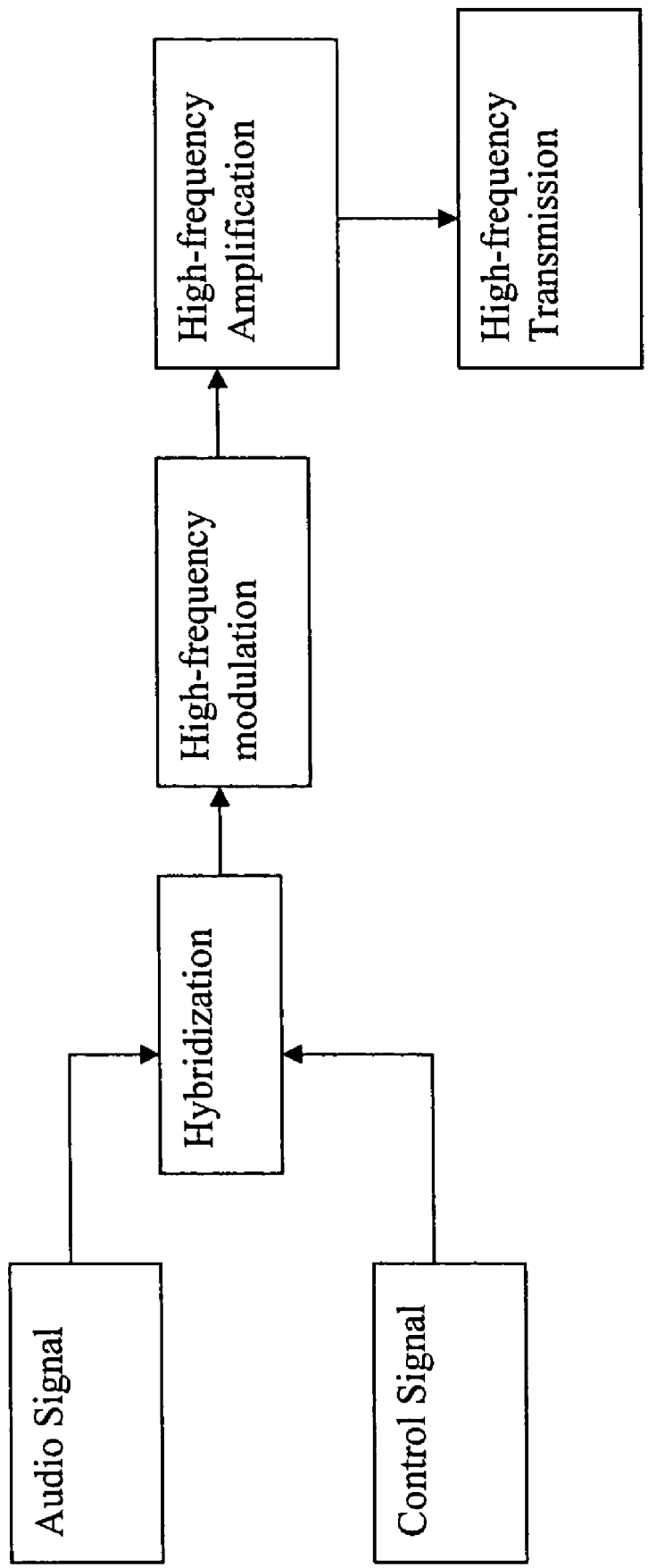
FIG. 2 is a flow diagram of a method of transmitting an audio signal and a control signal according to a preferred embodiment of the present invention.
Figure 3:
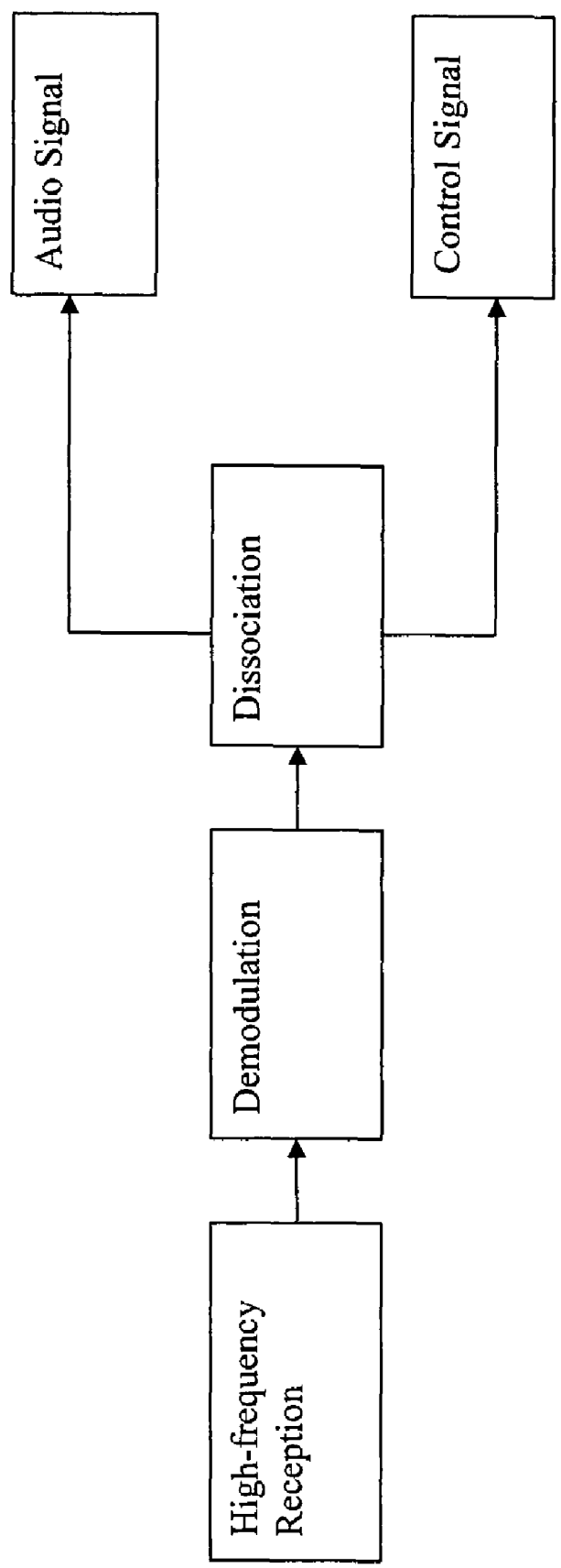
FIG. 3 is a flow diagram of a method of receiving an audio signal and a control signal according to the above preferred embodiment of the present invention.

Referring to FIGS. 2 and 3 of the drawings, a method of transmitting an audio signal and a control signal to a signal receiver according to a preferred embodiment of the present invention through a signal transmission arrangement is illustrated, wherein the signal transmission arrangement comprises a signal transmitter and a signal receiver wirelessly communicating with the signal transmitter.

According to the preferred embodiment, the transmitting method through the signal transmitter comprises the following steps.

(1) Hybridize the audio signal with the control signal to form a consolidating signal.

(2) High-frequency modulate the consolidating signal.

(3) Amplify the consolidating signal before transmitting the consolidating signal to the signal receiver in a wireless transmission manner.

The transmitting method through the signal receiver comprises the following steps.

(4) Receive the consolidating signal from the signal transmitter in a wireless manner.

(5) Demodulate the consolidating signal.

(6) Dissociate the consolidating signal to restore the audio signal and the control signal.

Accordingly, in step (1), the audio signal and the control signal are hybridized through a process of either frequency division multiplexing (FDM), time division multiplexing (TDM), or encoding.

In step (6), the consolidating signal is dissociated to restore the audio signal and the control signal by filtering or decoding.

According to the preferred embodiment, the signal transmission arrangement is embodied to incorporate with a wireless microphone system which comprises a wireless microphone and an audio output device wirelessly communicating with the wireless microphone, wherein the signal transmitter is built-in with the wireless microphone and the signal transmitter is built-in with the audio output device in such a manner that the audio signal is wirelessly transmitted from the wireless microphone to the audio output device through the signal transmission arrangement.

The signal transmitter comprises a hybrid signal device to hybridize the audio signal with the control signal to form the consolidating signal, a frequency modulator to high-frequency modulate the consolidating signal, wherein the consolidating signal is amplified and sent to the signal receiver in a wireless manner. It is worth to mention that the hybrid signal device is arranged to hybridize the audio signal with the control signal to form the consolidating signal by a frequency division multiplexer, a time division multiplexer, or an encoder.

The signal receiver comprises a frequency demodulator to demodulate the consolidating signal and a signal dissociating unit to dissociate the consolidating signal to restore the audio signal and the control signal by filter or decoder, which inverts the calculations of either the frequency division multiplexer, the time division multiplexer, or the encoder. In other words, the consolidating signal is dissociated to restore the audio signal and the control signal by filtering or decoder as the reverse process of frequency division multiplexing (FDM), time division multiplexing (TDM), or encoding.

Figure 4:
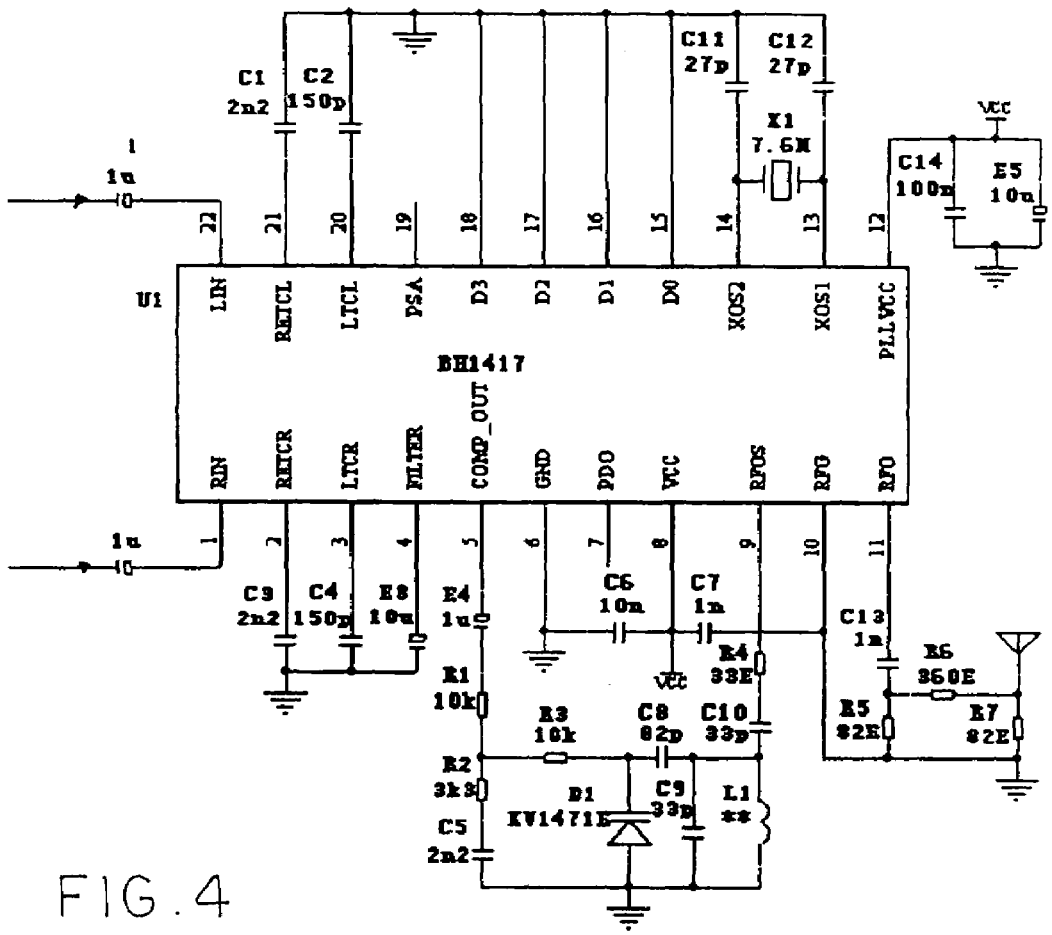
FIG. 4 is a circuit diagram of a signal transmitter according to the above preferred embodiment of the present invention.
Figure 5:
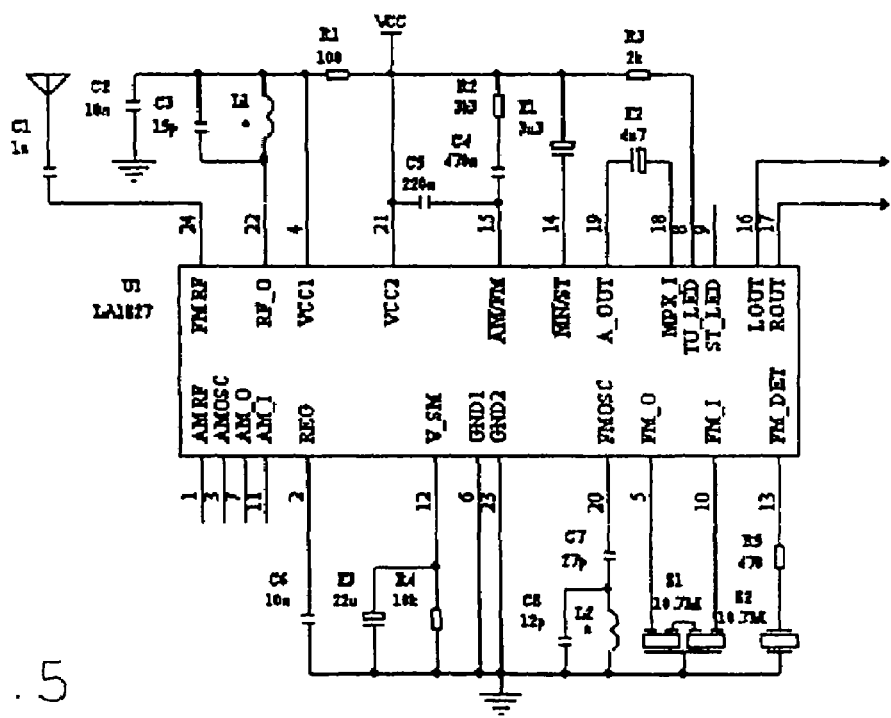
FIG. 5 is a circuit diagram of a signal receiver according to the above preferred embodiment of the present invention.

FIGS. 4 and 5 illustrates the circuit diagrams of the signal transmitter and the signal receiver of the signal transmission arrangement for transmitting the digital control signal and the analog voice signal respectively according to the preferred embodiment of the present invention.

The circuit of signal transmitter is embodied as an integrated transmitting circuit BH1417, wherein a stereo coding module as the hybrid signal device, the frequency modulator and a signal amplifier are integral to form the BH1417 integrated circuit such that a stereo coding module encodes and hybrids the audio signal and the digital signal.

Referring to FIG. 4, the following descriptions are the functionalities of each pin in the integrated circuit BH1417:

PIN 1: Right Audio Channel Input
PIN 22: Left Audio Channel Input
PIN 2: Pre-emphasis Time Constant (Right)
PIN 21: Pre-emphasis Time Constant (Left)
PIN 3: Low Pass Filter (15 KHz) Time Constant (Right)
PIN 20: Low Pass Filter (15 KHz) Time Constant (Left)
PIN 4: Reference Voltage
PIN 5: Composite Signal Output
PIN 6: Ground
PIN 7: Phase Locked Loop (PLL) Phase Detector Output
PIN 8: Power
PIN 9: Radio Frequency (RF) Oscillator
PIN 10: Radio Frequency (RF) Ground
PIN 11: Radio Frequency (RF) Output
PIN 12: Phase Locked Loop (PLL) Power
PIN 13 and PIN 14: External Oscillator
PIN 15 to PIN 18: Frequency Output Referring to FIG. 4 of BH1417, the PIN 1 is used as an input of the control signal, and PIN 22 is used as an input of the audio signals. The internal stereo coding module of BH1417 encodes the audio signal and the digital control signal and combines the signals thereof into the consolidating signal to the output in PIN 5, to which the low pass filter composed of two resistances and one capacitance, R1, R2 and C5, respectively, are connected. After the signals thereof pass through the low pass filter, the adjustable capacitance diode D1 modulates the high frequency in the signals and thereafter the BH1417 transmits the consolidating signal to the output in PIN 11, and then using the high-frequency transmitting antenna to emit the consolidating signal.

The circuit of signal receiver is embodied as an integrated circuit LA1827 for frequency modulation and amplitude modulation, wherein the frequency demodulator and a stereo decoding module as the signal dissociating unit are integral to form the integrated receiving circuit LA1827. Therefore, the consolidating signal is dissociated by the stereo decoding module.

Referring to FIG. 4, the following descriptions are the functionalities of each pin in the integrated circuit LA1827:

PIN 1, PIN 3, PIN 7 and PIN 11: Amplitude Modulation Signal Input (Floating)
PIN 2: Reference Voltage
PIN 4 and PIN 21: Power
PIN 5: Mixed Signal Frequency Modulation Input
PIN 6 and PIN 23: Ground
PIN 9: Stereo Receiver Indication Output
PIN 10: Frequency Modulation Band-pass Signal Input
PIN 12: Frequency Modulation Signal Intensity Indication Output
PIN 13: Frequency Modulation Discriminator Signal Input
PIN 14: Discriminator Filter
PIN 15: Phase Differential Filter
PIN 16: Left Audio Channel Output
PIN 17 Right Audio Channel Output
PIN 18: Stereo Decoding Module Input PIN 19: Frequency Modulation Discriminator Signal Output PIN 20: Mixed Signal Frequency Modulation Local Oscillator Input PIN 22: Mixed Signal Frequency Modulation Output PIN 24: Frequency Modulation Antenna The high-frequency consolidating signal, which is transmitted from the high-frequency transmitting antenna in the BH1417 of the signal transmitter and is received by the Frequency Modulation Antenna, is transferred through the capacitance C1 to the PIN 24. After the demodulation to recover the stereo mixed signals to the output of PIN 19 in LA1827, the capacitance E2 transfers the consolidating signal thereof to the internal stereo decoding module to restore the original audio signal and the control signal, outputting into the PIN 16 and PIN 17, respectively.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method of wirelessly transmitting an analog audio signal from a signal transmitter to a signal receiver, comprising the steps of:
   (a) hybridizing said audio signal having a frequency smaller than 20 KHz with a digital control signal to form a consolidating signal;
   (b) high-frequency modulating said consolidating signal;
   (c) amplifying said consolidating signal before transmitting said consolidating signal to said signal receiver in a wirelessly transmissible manner;
   (d) demodulating said consolidating signal in said signal receiver when said signal receiver wirelessly receives said consolidating signal; and
   (e) dissociating said consolidating signal to restore said audio signal and said control signal in said signal receiver;
   wherein in said step (a), said audio signal and said control signal are hybridized by a predetermined encoding technique, and wherein in said step (e), said consolidating signal is dissociated to restore said audio signal and said control signal by a corresponding decoding technique as a reverse process of said encoding technique.

2. The method as recited in claim 1, wherein in said step (a), said audio signal and said control signal are hybridized by frequency division multiplexing.

3. The method, as recited in claim 2, wherein in said step (e), said consolidating signal is dissociated to restore said audio signal and said control signal by filtering of said audio signal as a reverse process of said frequency division multiplexing.

4. The method, as recited in claim 1, wherein in said step (a), said audio signal and said control signal are hybridized by time division multiplexing.

5. The method, as recited in claim 4, wherein in said step (e), said consolidating signal is dissociated to restore said audio signal and said control signal by filtering as a reverse process of said time division multiplexing.

6. A signal transmission arrangement for transmitting an analog audio signal with a frequency less than 20 kHz and a digital control signal, comprising:
   a signal transmitter which comprises a hybrid signal device adapted to hybridize said analog audio signal with said digital control signal to form a consolidating signal, and a frequency modulator adapted to high-frequency modulate said consolidating signal, wherein said consolidating signal is further amplified and sent to said signal receiver in a wirelessly transmittable manner; and
   a signal receiver wirelessly communicating with said signal transmitter, wherein said signal receiver comprises a frequency demodulator adapted to demodulate said consolidating signal, and a signal dissociating unit adapted to dissociate said demodulated consolidating signal to restore said audio signal and said control signal from said consolidating signal,
   wherein said signal transmitter further comprises a signal amplifier, which amplifies said consolidating signal before said consolidating signal is wirelessly transmitted to said signal receiver, and is integrally connected with said hybrid signal device and said frequency modulator to form an integrated transmitting circuit;
   wherein said hybrid signal device comprises a time division multiplexer to hybridize said audio signal with said control signal by time division multiplexing;
   wherein said signal dissociating unit comprises a filter to dissociate said consolidating signal to restore said audio signal and said control signal by filtering technique as a reverse process of said time division multiplexing.

7. The signal transmission arrangement, as recited in claim 6, wherein said hybrid signal device comprises a frequency division multiplexer to hybridize said audio signal with said control signal by frequency division multiplexing.

8. The signal transmission arrangement, as recited in claim 7, wherein said signal dissociating unit comprises a filter to dissociate said consolidating signal so as to restore said audio signal and said control signal by filtering technique as a reverse process of said frequency division multiplexing.

9. The signal transmission arrangement, as recited in claim 8, wherein said frequency demodulator and said signal dissociating unit are electrically connected together to form an integrated receiving circuit.

10. The signal transmission arrangement, as recited in claim 6, wherein said hybrid signal device comprises an encoder to hybridize said audio signal with said control signal by encoding technique.

11. The signal transmission arrangement, as recited in claim 10, wherein said signal dissociating unit comprises a decoder to dissociate said consolidating signal to restore said audio signal and said control signal by decoding technique as a reverse process of said encoding.

12. The signal transmission arrangement, as recited in claim 11, wherein said frequency demodulator and said signal dissociating unit are electrically connected together to form an integrated receiving circuit.

* * * * *